Figure 1:
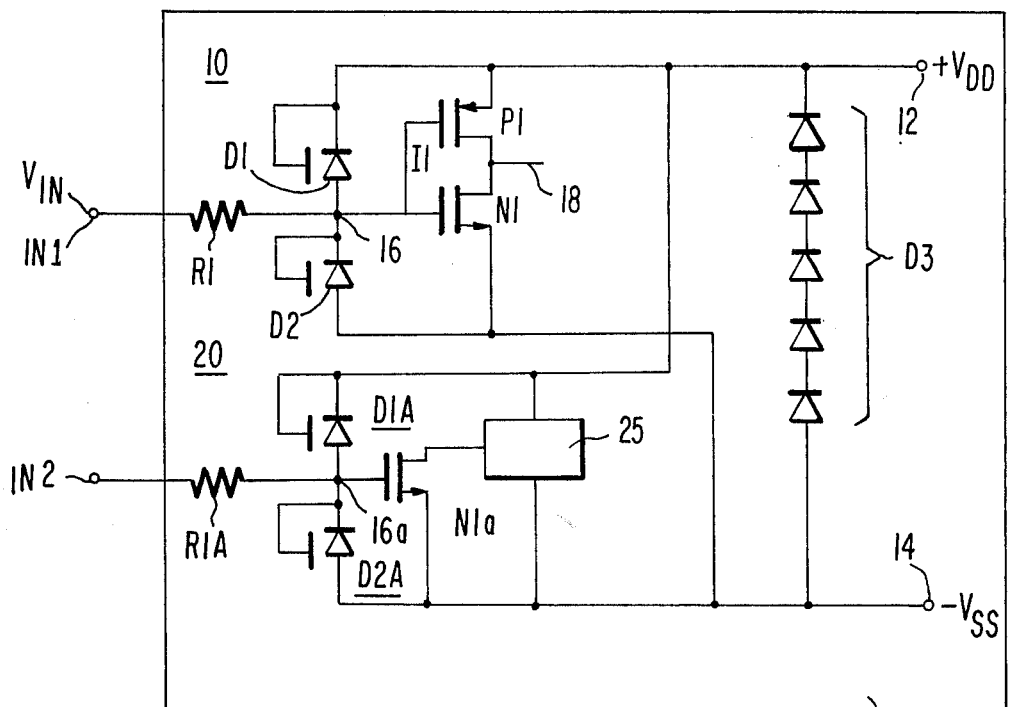

United States Patent [19]

Eaton, Jr.

[11] 4,037,140
[45] July 19, 1977

[54] PROTECTION CIRCUIT FOR INSULATED-GATE FIELD-EFFECT TRANSISTORS (IGFETS)

[75] Inventor: Sargent Sheffield Eaton, Jr., Phillipsburg, N.J.

[73] Assignee: RCA Corporation, New York, N.Y.

[21] Appl. No.: 676,808

[22] Filed: Apr. 14, 1976

[51] Int. Cl.$^2$ ............................................. H02H 3/20
[52] U.S. Cl. ..................................... 361/56; 307/304; 361/58
[58] Field of Search ........................ 317/16, 31, 33 R; 307/202 R, 304, DIG. 6

[56] References Cited

U.S. PATENT DOCUMENTS

| | | | |
|---|---|---|---|
| 3,712,995 | 1/1973 | Steudel | 307/304 |
| 3,947,727 | 3/1976 | Stewart | 317/31 |

FOREIGN PATENT DOCUMENTS

| | | | |
|---|---|---|---|
| 2,244,081 | 3/1974 | Germany | 317/16 |

OTHER PUBLICATIONS

"Series N-Channel Mosfet Gate Protection Circuit" IBM Tech. Disc. Bul. vol. 13 No. 9.

"Fundamentals of Cos/Mos Integrated circuits" Solid State Technology Apr. 1974, pp. 85–89.

*Primary Examiner*—Harry E. Moose, Jr.
*Attorney, Agent, or Firm*—H. Christoffersen; Henry I. Schanzer

[57] ABSTRACT

The gate of an IGFET, which is directly connected to the input terminal of a circuit is protected by means of first and second diodes connected between the gate and first and second points of operating potential, respectively. The first diode is poled to conduct current in the forward direction when the potential at the gate is more positive than the potential at the first point and the second diode is poled to conduct current in the forward direction when the potential at the gate is more negative than the potential at the second point. A high conductivity diode means is connected between the first and second points of potential. The reverse breakdown voltage ($V_R$) of the first and second diodes is greater than the $V_R$ of the diode means whereby the first and second diodes conduct only in the forward direction while the diode means conducts in the forward or reverse direction.

10 Claims, 4 Drawing Figures

PROTECTION CIRCUIT FOR INSULATED-GATE FIELD-EFFECT TRANSISTORS (IGFETS)

Insulated-gate field-effect transistors (IGFETs) have an extremely high input impedance resulting from an insulator layer placed over the conduction channel between the gate electrode and the substrate. To operate the transistor at practical voltage levels, the insulator layer has to be made relatively thin. However, a large potential applied across this thin insulator layer causes it to rupture resulting in a short circuit between the gate and the substrate of the transistor, which usually is a catastrophic failure.

The application of a high voltage to the gate may occur either as a result of the application of an input signal of large amplitude or due to the accumulation of static charge on the gate. Due to the high input impedance of the device (typically, the input resistance is greater than $10^{14}$ ohms and the input capacitance is in the order of $10^{-12}$ farads) even a small static charge on the gate is translated into a high potential.

Many different protection circuits have been suggested to prevent the rupture of the gate insulator. A known circuit includes first and second diodes connected anode-to-cathode between the two power supply terminals of a circuit and the gate electrode of an IGFET to be protected is connected to the common connection between the diodes. This protection scheme may also include a third diode connected between the two power terminals. In this protection scheme all the diodes are designed to conduct in either the forward direction or in the reverse direction.

Relying on reverse conduction through the first and second diodes for protection is problematic. The dynamic impedance of a diode is much higher in the reverse direction than in the forward direction. Thus, under high current condition (e.g., 20 to 30 amperes) the voltage drop across a diode operated in reverse breakdown may exceed the gate insulator rupture point. For this reason it is undesirable to rely upon the reverse breakdown characteristics for adequate gate insulator protection.

Furthermore, there is a problem with power handling capability. For a diode to conduct in the reverse direction its reverse breakdown voltage ($V_R$) must be exceeded. The $V_R$ of a diode may be, for example, in the range of 25 volts as compared to its forward voltage drop ($V_F$) which is typically in the range of 1 volt. Therefore, for the same value of current through the diode its power dissipation in the reverse direction is many times greater than in the forward direction. To handle the power dissipation developed across the diode in the reverse direction, as well as to reduce its dynamic resistance, the diode has to be made relatively large. This uses up valuable chip area and limits the number of circuits that can be formed on the chip. This problem is aggravated in circuits having more than one input terminal since at least two large diodes are required per input.

The power dissipation problem is even more serious in certain technologies, such as silicon-on-sapphire (SOS), in which the protection diodes, as well as the other components, are made by growing or depositing relatively thin films or layers on an insulator substrate. Since the junctions are formed of thin layers and since the insulator substrate is not a good heat conductor the protection diodes cannot dissipate much power without being destroyed. Consequently, each diode having a relatively high $V_R$ (e.g. 25 volts) is preferably replaced by several (e.g. 5) series connected diodes, each of the several diodes having a proportionately lower $V_R$ (e.g. 5 volts) whereby the power dissipation is shared by the several diodes. Many diodes (e.g. 10) are therefore required to protect each input and since considerable power still has to be dissipated the diodes have to be made with relatively large area. Thus, large sections of chip area have to be set aside to make protection diodes which can handle the large power dissipation seen by the diodes under reverse breakdown condition. Where chip area is at a premium this is highly undesirable.

An additional problem in the SOS technology is that standard diode circuits formed of N+ and P+ conductivity type regions have relatively high leakage. This is a serious disadvantage since it effectively lowers the high input impedance of the IGFET circuits.

Protection circuits embodying the invention include first and second diodes connected in series (anode-to-cathode) between first and second power terminals. The gate electrode of a transistor to be protected is connected to the common connection of the two diodes. A high conductivity diode means, having higher current carrying capability and a lower reverse breakdown voltage than the first and second diodes, is connected between the first and second power terminals.

The first and second diodes may be gated diodes and the diode means may comprise one or more PN junctions connected in series.

Figure 3:
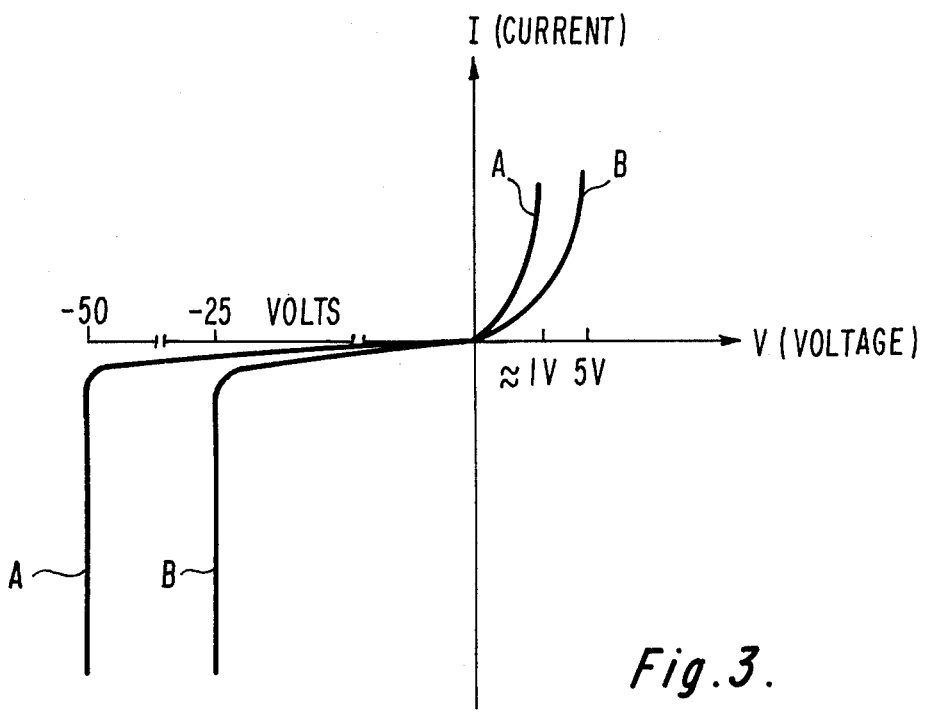
Figure 2:
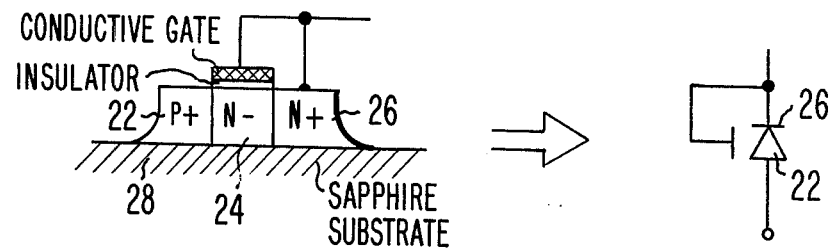
Figure 4:
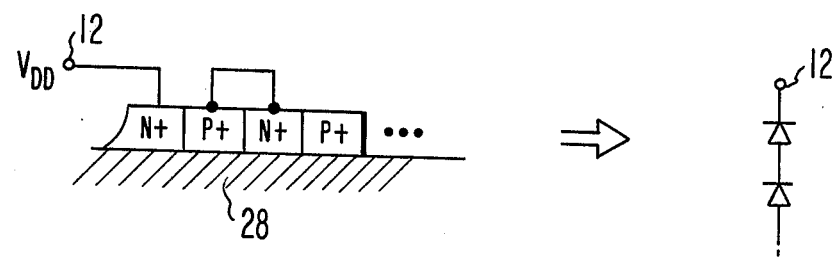

In the accompanying drawing like reference characters denote like components, and FIG. 1 is a schematic diagram of a circuit embodying the invention;

FIGS. 2 and 4 are cross-sections of diodes that may be used in the circuit of FIG. 1; and FIG. 3 is a drawing of the voltage-current (V-I) characteristics of the diodes shown in FIGS. 2 and 4.

FIG. 1 shows an integrated circuit 2 which includes a circuit 10 having an input terminal IN 1 connected via a resistor R1 to an input node 16 to which are connected the gate electrodes of IGFETs P1 and N1 which are interconnected to form complementary inverter I1. The sources of IGFETs P1 and N1 are connected to terminals 12 and 14, respectively, and their drains are connected to node 18. To operate the circuit, an operating potential of $+V_{DD}$ volts is applied to terminal 12 and a potential of $V_{SS}$ volts is applied to terminal 14, with $+V_{DD}$ being more positive than $V_{SS}$.

A gate controlled (gated) diode D1 is connected at its anode to node 16 and at its cathode to terminal 12 and a gated diode D2 is connected at its anode to terminal 14 and at its cathode to terminal 16. That diodes D1 and D2 are gated diodes is illustrated by means of a gate electrode positioned adjacent each diode between its anode and cathode. Each gated diode has its gate electrode connected to its cathode. In the SOS process gated diodes (also known as P-I-N diodes) can be fabricated by replacing the normal P+ drain (or source) region of a P+ conductivity type IGFET with an N+ region.

Specifically, diodes D1 and D2 may be formed as shown in cross-section in FIG. 2. A relatively highly doped P+ region 22 which defines the anode of the diode is formed on a sapphire substrate 28. Contiguous to region 22 is a relatively lightly doped region 24 of N− conductivity and contiguous thereto is a relatively highly doped region 26 of N+ conductivity which defines the cathode of the diode. Overlying region 24 is an insulator layer (silicon dioxide) over which is formed a gate electrode of conductive material (metal or polysilicon). The gate electrode of each gated diode is connected to its cathode (region 26) to increase the normal $V_R$ of the diode and decrease its leakage current. The gated diode, as connected, is characterized by a relatively high $V_R$ which is achieved without using an extremely lightly doped region. That is, region 24 though lightly doped is not very lightly doped. This ensures that the diode is also characterized by a relatively low forward dynamic resistance. This makes the gate diode particularly applicable to oxide protection circuits of the type shown in FIG. 1.

The V-I characteristics of a gated diode in the forward direction are similar to the characteristics of typical PN junctions as shown in a curve A of FIG. 3. The forward voltage drop ($V_F$) of a gated diode is approximately 0.7 or 0.8 volt, but for ease of illustration the $V_F$ is assumed herein to be equal to 1 volt. [Although the $V_F$ of the diodes is assumed, for ease of description, to be relatively constant, it should be noted that the voltage drop across each diode is a function of its dynamic impedance and the current through it.] The $V_R$ of the gated diodes is a function of the doping level of the N− and P+ regions 24 and 22 and of the potential applied to the gate of the diode. In the circuit of FIG. 1 as shown in curve A of FIG. 3, gated diodes D1 and D2 are designed to have a $V_R$ of approximately 50 volts. The leakage current (current flowing in the reverse direction before breakdown) of the gated diodes is in the order of nanoamperes. The gated diodes are low leakage devices and are therefore more suitable for use with IGFETs than the standard diodes formed of contiguous P+ N+ diode regions which in SOS tend to have much higher leakage currents.

Five diodes, denoted D3 and also referred to herein as a composite diode or diode means, are connected in series between terminals 14 and 12 and are poled to conduct current from node 14 into node 12. Diode D3 may be formed of series connected P+ and N+ regions as shown in FIG. 4.

The $V_F$ of each PN junction is approximately 0.7 volt or 0.8 volt and the total $V_F$ of the composite diode is the sum of the $V_F$ of each diode. For ease of description it is assumed herein that the net $V_F$ of diode D3 is 5 volts as shown in waveform B of FIG. 3. Where the circuit of FIG. 1 is designed to be operated at 15 volts, the protection diode D3 may be designed to have a $V_R$ of 25 volts to protect IGFETs P1 and N1 against potentials which exceed the 25 to 30 volt range. Each PN junction of diode D3 is then designed to have a $V_R$ of 5 volts such that the total $V_R$ of diode D3 ($V_{RD3}$) is 25 volts.

Diode D3 is preferably made larger in area than diodes D1 or D2 which enables it to safely dissipate more power and also increases its conductivity in both the forward and reverse directions.

Diodes D1 and D2 are designed to have a higher $V_R$ than the $V_R$ of diode D3. The importance of this feature, discussed below, is that it prevents diodes D1 and D2 from conducting in the reverse direction. That is, diodes D1 and D2 conduct only in the forward direction while diode D3 conducts in the forward or reverse direction, and the lower $V_R$ of diode D3 prevents diodes D1 and D2 from conducting in the reverse direction.

The roles of diodes D1, D2, and D3 and resistor R1 in protecting IGFETs P1 and N1 from being subjected to potential stresses exceeding predetermined levels will now be discussed.

For purpose of explanation, assume: (a) that the circuit 10 of FIG. 1 is designed to be operated at a maximum operating potential of 15 volts (e.g. $+V_{DD} = 15$ volts, $V_{SS} = 0$ volts), and that the protection circuit is to prevent potentials in excess of 30 volts from being developed across the gate insulators of the IGFETs; (b) diodes D1 and D2 each have a $V_R$ of 50 volts ($V_{RD1} = V_{RD2} = 50$ volts) and a $V_F$ of 1 volt ($V_{FD1} = V_{FD2} = 1$ volt); (c) that diode D3 comprises five large serially connected P+N+ junctions each junction having a $V_F$ of 1 volt and a reverse breakdown of 5 volts. Thus, the $V_F$ of diode D3 ($V_{FD3}$) is 5 volts and its $V_R$ ($V_{RD3}$) is 25 volts; (d) the potentials at the input terminal IN1, at terminal 12 and at terminal 14, will be referred to as $V_{IN}$, $V_{12}$ and $V_{14}$, respectively.

It is also assumed that the transistors P1 and N1 are formed on the same sapphire substrate as the diodes and that the potential at their sources is approximately equal to their respective substrate potentials. In SOS, the substrate region of each IGFET includes the region of material between the source and the drain which is of different conductivity type than the source and drain regions. In a P type IGFET the source and drain regions are of P conductivity type and the substrate region is of N conductivity type. In an N type IGFET the source and drain regions are of N conductivity type and the substrate region is of P conductivity type. In SOS the substrate region is generally not accessible and is therefore not directly connected to any fixed potential. However, the substrate of a P type IGFET may be assumed to be at, or slightly below, the potential at its source due to the PN junction formed by the source (P) and substrate (N). Similarly the substrate of the N type IGFET may be assumed to be at, or slightly above, the potential at its source due to the PN junction formed by the substrate (P) and the source (N). Thus controlling the gate to source potential controls the gate to substrate potential which is the potential across the gate insulator. The operation of the circuit 10 of FIG. 1 is first discussed for the condition when a power supply or battery is connected between terminals 12 and 14.

If the input signal ($V_{IN}$) is more positive than and exceeds $V_{12}$ by more than $V_F$ volts, current flows from IN1 through resistor R1 and through diode D1 into terminal 12. The voltage drop across diode D1 is $V_F$ volts. The potential at node 16 ($V_{16}$) is then equal to [$V_{DD} + V_F$] volts ($\approx 16$ volts).

If $V_{In}$ is more negative than and exceeds $V_{14}$ by more than $V_F$ volts, current flows from terminal 14 through diode D2 and resistor R1 into terminal IN1. The voltage drop across diode D2 is $V_F$ volts and $V_{16}$ will thus be equal to $V_{SS}$ volts minus $V_F$ volts ($\approx -1$ volt). For the two conditions above resistor R1 functions to limit the current flowing through diodes D1 and D2.

If, for any reason, the power supply potential $V_{DD}$ exceeds $V_{SS}$ by more than $V_{RD3}$ (i.e. 25 volts), diode D3 breaks down in the reverse direction and clamps the potential between terminals 12 and 14 to 25 volts. Since $V_{12}$ is at most $V_{RD3}$ volts above $V_{14}$ and since the potential at node 16 can only be one $V_F$ drop above $V_{12}$ or one $V_F$ drop below $V_{14}$ the potential stress between the gate and source electrodes of transistors P1 and N1 does not exceed $V_{RD3}$ volts plus the $V_F$ of diodes D1 or D2.

If $V_{14}$ is more positive than $V_{12}$ by more than two diode drops, diodes D1 and D2 conduct current in the forward direction between terminals 14 and 12.

Clearly for any of the conditions discussed above the IGFETs are protected and diodes D1 and D2 do not conduct in the reverse direction.

The operation of the protection circuit is now examined for stress conditions that may exist between any two of terminals IN1, 12, and 14 due to the presence of electrostatic charges or other transient signals. These stress conditions may occur when the circuit is connected in a circuit, or is being connected to, or disconnected from a power supply, or is being handled in any one of numerous ways. Therefore, in the discussion to follow it is assumed that a potential is applied between two of these three terminals and that the third terminal is floating.

a. Consider the condition when $V_{12}$ is highly positive with respect to $V_{IN}$ and terminal 14 is floating. In prior art circuitry with diode D1 having a $V_R$ equal to or less than diode D3, diode D1 would be operated in the reverse breakdown condition when $V_{12}$ would exceed $V_{IN}$ by more than the $V_R$ of diode D1.

In the circuit of FIG. 1, as soon as $V_{12}$ exceeds $V_{IN}$ by an amount equal to $V_{RD3} + V_{FD2}$ volts, diode D3 breaks down and conducts in the reverse direction and diode D2 conducts in the forward direction clamping the potential between terminals 12 and 16 to $V_{RD3} + V_{FD2}$ volts. For the values assumed above this potential is approximately 26 volts. Since $V_{RD1} (\approx 50$ volts) is greater than 26 volts, diode D1 does not conduct in the reverse direction since it is not stressed more than $(V_{RD3} + V_{FD2})$ volts.

b. If $V_{12}$ is highly positive and $V_{14}$ is grounded with $V_{IN}$ floating then, as discussed above, diode D3 breaks down in the reverse direction and the potential between terminals 12 and 14 is held at $V_{RD3}$ (25 volts).

c. Consider now the condition when $V_{14}$ is highly negative with respect to $V_{IN}$ and terminal 12 is floating or if $V_{IN}$ is highly positive with respect to $V_{14}$ and terminal 12 is floating.

In the circuit of FIG. 1, as soon as $V_{IN}$ is more positive than $V_{14}$ by an amount equal to $V_{RD3} + V_{FD1}$, diode D3 breaks down and conducts in the reverse direction and diode D1 conducts in the forward direction. The potential between node 16 and terminal 14 is limited to $V_{RD3} + V_{FD1} (\approx 26$ volts). Since $V_{RD2} (\approx 50$ volts) is greater than 26 volts, diode D2 does not conduct in the reverse direction.

Thus, so long as the $V_R$ of diodes D1 or D2 is greater in magnitude than the $V_R$ of diode D3 plus the $V_F$ of diodes D1 or D2, diodes D1 and D2 will not be operated in the reverse direction. Therefore, these diodes can be made small since they will not be subjected to the higher power dissipation seen by diodes operated in the reverse direction.

The integrated circuit of FIG. 1 includes a second circuit 20 having an input IN2 connected via a resistor R1a to a node 16a to which is connected the gate of IGFET N1A. The source of IGFET N1a is connected to line 14 while its drain is connected to a network 25 coupled between power supply lines 12 and 14. Diodes D1a and D2a are connected between node 16a and lines 12 and 14, respectively.

This illustrates that the integrated circuit 2 could include a multiplicity of circuits (e.g. 10, 20) each having one or more input terminals adapted to receive an external input signal. Each input terminal to which is connected the gate of an IGFET requires two protection diodes (D1a, D2a). However all the circuits of the IC can share diode D3 and only one such (composite) diode is required per IC. Clearly then it is practical to make diode D3 a very large diode (s) capable of handling large currents in the reverse direction and dissipating much power. The input protection diodes, which come in pairs, have to be repeated for each input and are preferably small low leakage diodes with low forward dynamic resistance.

The protection circuit comprising diodes D1, D2 and D3 and resistor R1 in addition to protecting the IGFETs also function to protect itself. Diode D3 which is optimized to carry current in the reverse direction prevents diodes D1 and D2 from conducting in the reverse direction. Diodes D1 and D2 are optimized for conduction in the forward direction and resistor R1 limits the current through these diodes.

The invention has been discussed in terms of SOS type structures, but it is equally applicable to diodes and to transformers formed in bulk silicon.

Diodes D1 and D2 have been illustrated as gated diodes, but it should be clear that any diodes could be used instead so long as their reverse breakdown is greater than the reverse breakdown of diode D3.

Although diode D3 has been shown as comprising multiple diodes it could be a single junction.

Diodes D1 and D2 although capable of operating in the reverse direction are (due to D3) operated solely as unidirectional elements and could be replaced by any element which conducts unidirectionally. Thus, diodes D1 and D2 could be replaced by SCRs or transistors or any other rectifying type element.

What is claimed is:

1. For use with an insulated-gate field-effect transistor (IGFET) having first and second regions defining the ends of a conduction channel and having a gate electrode insulated from and overlying said conduction channel, a protection circuit comprising:

first and second terminals for the application of an operating potential therebetween;

means coupling said first region to said first terminal and means coupling said second region to said second terminal;

first and second diodes and a diode means each of said diodes and diode means having a forward voltage drop ($V_F$) when conducting current in the forward direction and having a reverse breakdown voltage drop ($V_R$) when conducting current in the reverse direction, wherein the $V_F$ of each one of said diodes and diode means is significantly less than its $V_R$, and wherein the $V_R$ of said first and second diodes is greater than the $V_R$ of said diode means plus the $V_F$ of one said first and second diodes;

means connecting said first diode between said gate electrode and said first terminal poled to conduct current in the forward direction from said gate into said first terminal when the potential at said gate electrode exceeds the potential at said first terminal by more than the $V_F$ of said first diode;

means connecting said second diode between said gate electrode and said second terminal poled to conduct current in the forward direction from said second terminal into said gate when the potential at said gate electrode is less than the potential at said second terminal by more than the $V_F$ of said second diode; and means connecting said diode means between said first and second terminals for conducting current in the forward direction from said second terminal into said first terminal when the potential at said second terminal exceeds the potential at said first terminal by more than the $V_F$ of said diode means and for conducting current in the reverse direction from said first terminal to said second terminal when the potential at said first terminal exceeds the potential at said second terminal by more than the $V_R$ of said diode means.

2. The combination as claimed in claim 1 wherein each one of said first and second diodes conducts current solely in the forward direction and wherein said diode means conducts current in the forward or reverse direction.

3. The combination as claimed in claim 2 wherein said first and second diodes are gate controlled diodes.

4. The combination as claimed in claim 2 wherein said IGFET, said first and second diodes, and said diode means are formed on an insulator substrate.

5. The combination as claimed in claim 4 wherein each one of said first and second diodes includes: (a) first, second and third semiconductor regions, the first and second regions being relatively highly doped regions of first and second conductivity type, respectively and the third region being a relatively lightly doped region of said second conductivity type, the first and second regions being spaced apart and contiguous to said third region; (b) an insulator layer overlying said third region; and (c) a gate electrode overlying said insulator connected to said second region.

6. The combination as claimed in claim 5 wherein said first region is the anode of each diode and said second region is the cathode of each diode.

7. The combination as claimed in claim 5 wherein said diode means includes N series connected PN junctions, where N is an integer greater than one, and wherein the reverse breakdown of each PN junction is equal to the $V_R$ of said diode means divided by N.

8. The combination as claimed in claim 2 further including an input terminal and a resistor connected between said input terminal and the gate of said IGFET.

9. The combination as claimed in claim 2 wherein said diode means includes at least one region of P conductivity type defining an anode and one region of N conductivity type defining a cathode; and wherein said cathode region is coupled to said first terminal and said anode region is coupled to said second terminal.

10. In a circuit having a plurality of input terminals, each terminal having connected thereto the gate electrode of an insulated-gate field-effect transistor (IGFET) and the circuit having first and second lines for the application therebetween of an operating potential, the improvement comprising:

two diodes per input terminal, each input terminal having connected thereto the anode of one diode and the cathode of the other one of said two diodes; the cathode of said one diode being connected to said first line and the anode of the other one of said two diodes being connected to said second line;

a diode means having a forward voltage drop ($V_F$) when conducting in the forward direction and a reverse voltage drop ($V_R$) when conducting in the reverse direction, and the $V_R$ of said diode means being less than the $V_R$ of any of said diodes; and means connecting said diode means between said first and second lines poled to conduct current in the forward direction from said second line to said first line and in the reverse direction from said first line to said second line.

* * * * *

UNITED STATES PATENT OFFICE
CERTIFICATE OF CORRECTION

PATENT NO. : 4,037,140

DATED : July 19, 1977

INVENTOR(S) : Sargent S. Eaton, Jr.

It is certified that error appears in the above-identified patent and that said Letters Patent are hereby corrected as shown below:

Column 2, line 60 change "P+" to --- P ---.

Column 6, line 21 change "transformers" to ---transistors ---.

Signed and Sealed this

Twenty-fifth Day of October 1977

[SEAL]

Attest:

RUTH C. MASON
Attesting Officer

LUTRELLE F. PARKER
Acting Commissioner of Patents and Trademarks